United States Patent [19]

Patel

[11] Patent Number: 5,757,621
[45] Date of Patent: May 26, 1998

[54] HEAT SINK ASSEMBLY EMPLOYING SPRING-LOADED STANDOFFS

[75] Inventor: Naresh C. Patel, Howell, N.J.

[73] Assignee: Lucent Technologies Inc., Murray Hill, N.J.

[21] Appl. No.: 660,012

[22] Filed: Jun. 6, 1996

[51] Int. Cl.[6] .................................................. H05K 7/20
[52] U.S. Cl. ........................ 361/719; 257/719; 361/809
[58] Field of Search .............................. 165/80.3, 185; 174/16.3; 257/706–707, 712–713, 718–719, 726–727; 361/688, 690, 704, 709, 710, 715, 809

[56] References Cited

U.S. PATENT DOCUMENTS 5,384,940  1/1995  Soule et al. ........................... 361/719
5,590,026  12/1996  Warren et al. ........................ 361/704
5,603,374  2/1997  Wu ....................................... 165/185
5,621,615  4/1997  Dawson et al. ...................... 361/715

FOREIGN PATENT DOCUMENTS 4162459  6/1992  Japan ..................................... 257/718
5160588  6/1993  Japan ..................................... 361/715

Primary Examiner—Gregory D. Thompson
Attorney, Agent, or Firm—Frederic B. Luludis

[57] ABSTRACT

A heat sink may be shared among a plurality of electronic devices attached to a printed circuit board by attaching the heat sink to the printed circuit board using a plurality of standoff/spring combinations. In this way, the level of compression imposed by the springs on the heat sink allows the heat sink to make the appropriate level of thermal contact with the electronic devices.

4 Claims, 3 Drawing Sheets

HEAT SINK ASSEMBLY EMPLOYING SPRING-LOADED STANDOFFS

BACKGROUND OF INVENTION

Conventional techniques for cooling electronic devices mounted on a printed circuit board include attaching a heat sink to each electronic device, e.g., an integrated circuit package. Such attaching is typically done by press fitting a spring clip heat sink to the electronic package, and, therefore is labor intensive. Moreover, there are only a limited number of different styles of electronic packaging (e.g., so-called TO22 packaging) that have the appropriate shape for accepting such a heat sink. It is also difficult to share a spring-clip heat sink among several electronic devices/package.

SUMMARY OF INVENTION

The foregoing problems associated with sharing a heat sink among several electronic devices/packages are overcome and the relevant art is advanced as a result of my novel method for attaching large heat sinks to multiple devices having different types of packaging. Specifically, such attaching includes affixing cylindrical stand-offs (typically 4 to 6 per heat sink) at locations that are symmetrically about the surface of a printed circuit board (PCB) and as close as possible to the electronic packages attached to the PCB. This arrangement restricts the heat sink from moving in a plane parallel to the PCB surface but not in a direction perpendicular to the PCB surface. This degree of freedom in the vertical direction ensures that the electronic packages will not be subject to high compressive forces that could arise with dimensional variations of rigid mechanical assemblies. Further, a compressive helical spring (one spring per stand-off) with a constant stiffness constant is also used to control the force with which the heat sink contacts the electronic package. A thin film of thermal compound between the shared heat sink and electronic devices is used to improve efficiency of the transfer of heat between the electronic devices and share heat sink. Further, the height of each stand-off is designed to provide the appropriate spring compression to regulate the force exhibited by the spring on the heat sink and on the electronic packages.

These and other aspects of the claimed invention will be appreciated by referring to the ensuing detailed description and accompanying drawings.

DETAILED DESCRIPTION OF INVENTION

Figure 1:
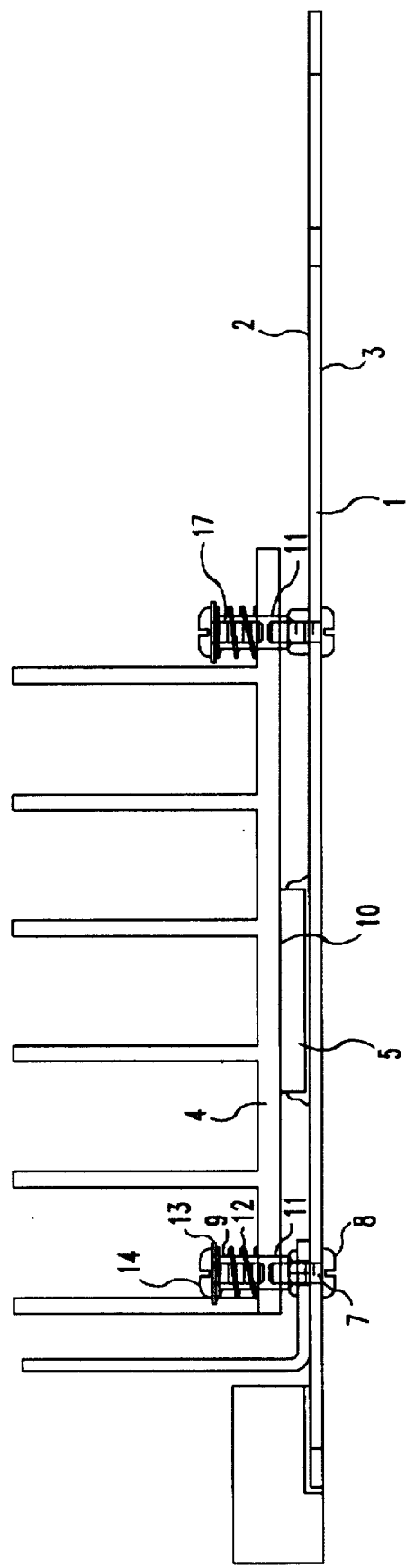
FIG. 1 is a side view of a printed circuit board and a shared heat sink arranged in accord with the principles of my invention.
Figure 2:
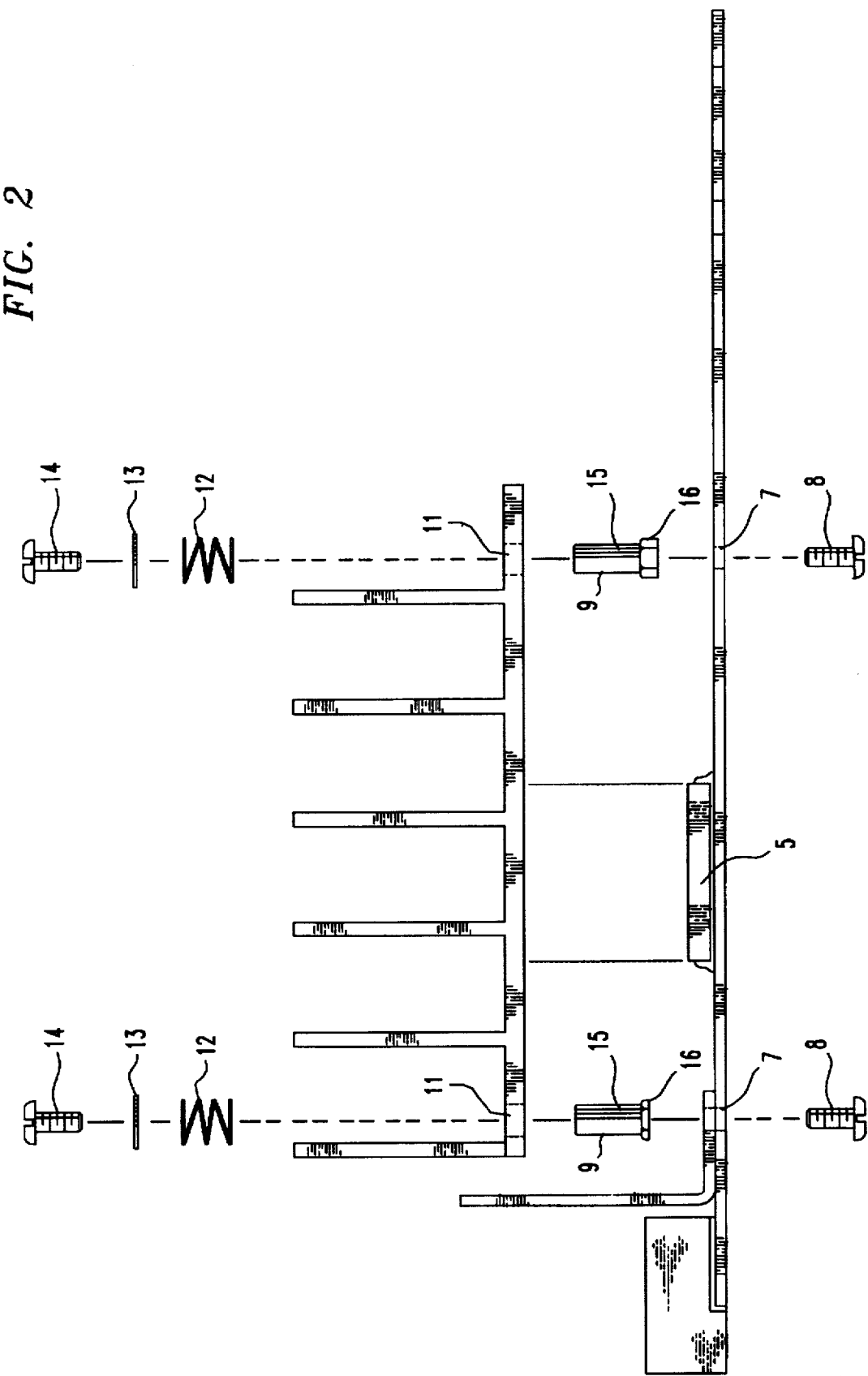
FIG. 2 is an exploded view of heat sink assembly of FIG. 1.

In an illustrative embodiment of the invention, Printed Circuit Board (PCB), FIG. 1, has a number of different types of electronic devices soldered (mounted) to a top side/surface 2 as well as to a bottom side/surface 3. However, only those electronic devices that are a source of heat and susceptible thereto are thermally connected to shared heat-sink base 4. Electronic devices that typically need to be in contact with the heat sink base include, for example, integrated circuits 5 and 6 (shown more clearly in FIG. 2).

More particularly, PCB 1 is designed with a plurality of plain through holes 7 each of a specific diameter to accept entry of a screw 8 that threads into a first threaded hole formed in one end of a respective stand-off 9 to secure the standoff to the top surface of PCB 1. To ensure that the standoff does not become loose as a result of vibration, the torque that may be applied to screw 8 is preferably in the range of 4 inch-pounds to 7 inch-pounds. Although, only two stand-offs are shown FIG. 1, the assembly of one such stand-off equally pertains to of all the stand-offs that are so used to secure shared heat sink 4 to PCB 1 such that heat sink 4 makes thermal contact with the appropriate electronic devices mounted on PCB 1. For example, a minimum of four stand-offs and a maximum of 8 stand-offs are typically needed to attach a shared heat sink to a PCB.

Continuing, a thin film of thermally conductive compound 10 (viscous fluid) may be applied to the top of each electronic device (package) 5 (6, FIG. 2) that will come into contact with heat sink 4 as is done conventionally. A plurality of through holes 11 are formed along the perimeter (e.g., the four corners and middle) of heat sink 4. Each such hole has a diameter which allows a cylindrical neck portion 15 (FIG. 2) of a respective stand-off 9 to move up and down freely but not side ways. The height of a shoulder portion 16 of stand-off 9 is less than the height of devices 5 and 6 to allow heat sink 4 to make full contact with the thermally conductive compound applied to the tops of devices (packages) 5 and 6 (as is shown in FIG. 3).

A spiral spring 12 is then slid over neck 15 until it makes contact with the top surface of the base of the heat sink. It is seen from FIGS. 1 and 2 that one spring per stand-off is used to reduce the compression force on the devices 5 and 6 while still maintaining a high degree of thermal contact between these devices and heat sink 4. Spring 12, more particularly, is compressed by means of washer 12 and screw 14, which is threaded into a tapped hole formed in the other end of stand-off 9. The torque that may be applied to screw 14 in this case may be in the range of 4 inch-pounds to 7 inch-pounds.

Each of the stand-offs is preferably fabricated from an aluminum stock rod of 3/16 inch hexagonal cross section. The shoulder portion 16 may have a 3/16 inch hexagonal cross section so that it makes contact with the top surface 2 of PCB 1. Neck portion 15, on the other hand, is circular in cross section and has a diameter that is compatible with spring 12 and, at the same time, has sufficient material to accommodate a tapped hole through the entire length of stand-off 9. Hole 17 that extends the entire length of stand-off 9 is tapped to accept at respective ends thereof screw 8 and 14 to respectively hold stand-off 9 firmly to the PCB and lock spring 12 as shown in FIG. 1. The length of each stand-off 9 is designed to limit the compression of spring 12 so that the level of force applied to heat sink 4 and to the electronic packages 5 and 6 is also limited to a predetermined magnitude (e.g., a total of 3 pounds per package). (It is noted that the height of an electronic package, the thickness of the base of a heat sink and the length of the uncompressed spring are factors that need to be considered in selecting the length of a stand-off.

Figure 3:
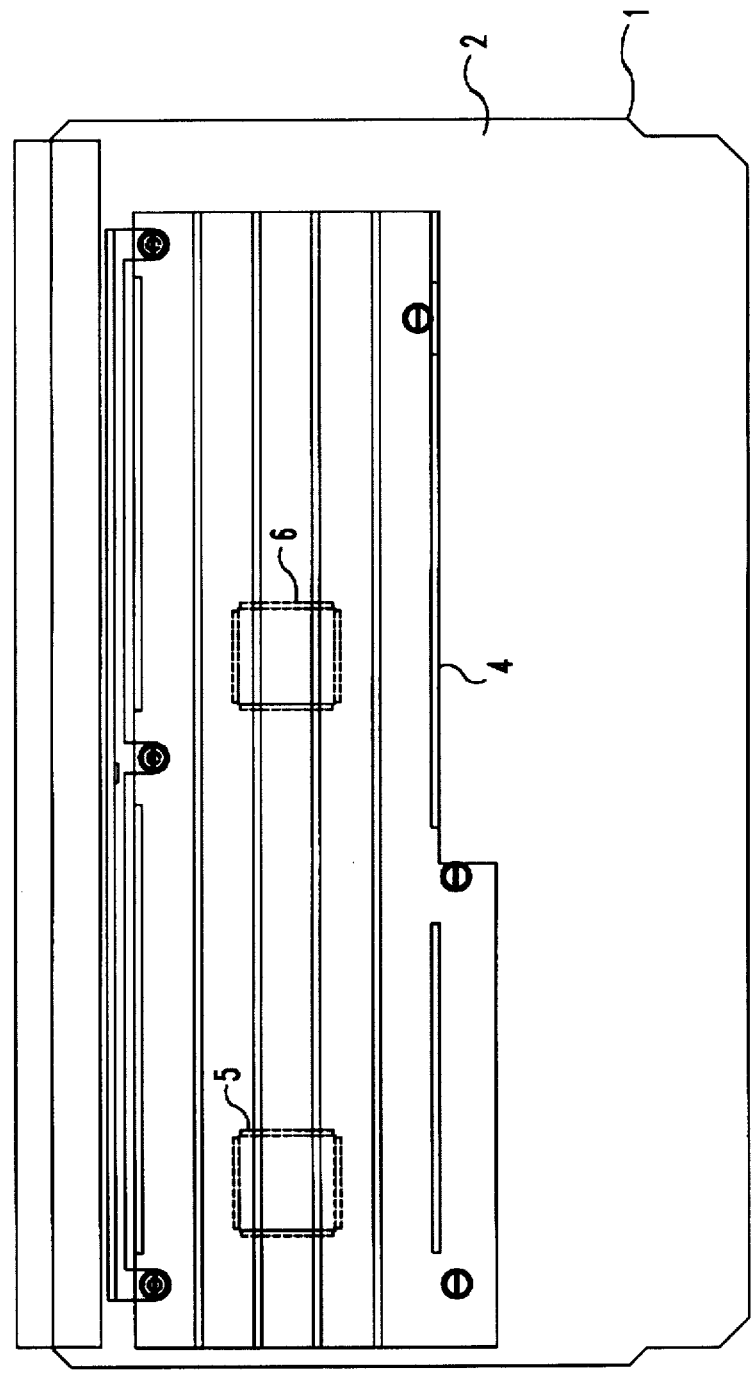
FIG. 3 is a top view of the printed circuit board/shared heat sink assembly of FIG. 1.

The overall assembly of heat sink 4 and PCB 1 having devices 5 and 6 soldered to top side 2 is shown in FIG. 3.

It is noted that top and bottom latches (not shown) may be attached to PCB 1 to facilitate the removal of the PCB from a connector (not shown) as well as facilitate the insertion thereof into an associated connector.

The foregoing is merely illustrative of the principles of the invention. Those skilled in the art will be able to devise numerous arrangements, which, although not explicitly shown or described herein, nevertheless embody those principles that are within the spirit and scope of the invention.

I claim:

1. A method of attaching a heat sink to a printed circuit board comprising the steps of forming a plurality of holes at symmetrical locations around the periphery of said heat sink and a like number of holes at corresponding locations in said printed circuit board, positioning between corresponding holes formed in said heat sink and said printed circuit board a standoff having a threaded through hole, each said standoff having neck and shoulder portions such that only said neck portion protrudes through the corresponding one of said heat sink holes, affixing each said standoff to said printed circuit board by inserting a first screw through a corresponding one of said printed circuit board holes and then threading said first screw into the shoulder portion of the standoff positioned at that hole, and inserting a spring over the neck portion of each standoff protruding through a corresponding one of the holes formed in said heat sink and securing each said spring to its corresponding standoff by threading a second screw into the threads formed in the neck portion of the corresponding standoff so that a bottom surface of said heat sink may be held in contact with at least one of a plurality of electronic devices attached to a top surface of said printed circuit board.

2. The method of claim 1 furthering comprising the step of sliding a washer over said second screw and then threading the second screw into said neck portion.

3. A method of attaching a heat sink to a printed circuit board comprising the steps of forming a plurality of holes at symmetrical locations around the periphery of said heat sink and a like number of holes at corresponding locations in said printed circuit board, positioning between corresponding holes formed in said heat sink and said printed circuit board a standoff having a threaded through hole, each said standoff having neck and shoulder portions such that only said neck portion protrudes through the corresponding one of said heat sink holes, affixing each said standoff to said printed circuit board by inserting a first screw through a corresponding one of said printed circuit board holes and then threading said first screw into the shoulder portion of the standoff positioned at that hole, and inserting a spring over the neck portion of each standoff protruding through a corresponding one of the holes formed in said heat sink and securing each said spring to its corresponding standoff by threading a second screw into the threads formed in the neck portion of the corresponding standoff so that a bottom surface of said heat sink may be held in contact with at least one of a plurality of electronic devices attached to a top surface of said printed circuit board, in which the neck portion of each said standoff is set to a predetermined height to automatically limit the compression of the inserted spring to a predetermined magnitude.

4. The method of claim 2 furthering comprising the step of sliding a washer over said second screw and then threading the second screw into said neck portion.

* * * * *